US007948256B2

(12) United States Patent
Furukawa

(10) Patent No.: US 7,948,256 B2
(45) Date of Patent: May 24, 2011

(54) MEASUREMENT APPARATUS, TEST SYSTEM, AND MEASUREMENT METHOD FOR MEASURING A CHARACTERISTIC OF A DEVICE

(75) Inventor: Yasuo Furukawa, Saitama (JP)

(73) Assignee: Advantest Corporation, Tokyo (JP)

( * ) Notice: Subject to any disclaimer, the term of this patent is extended or adjusted under 35 U.S.C. 154(b) by 114 days.

(21) Appl. No.: 12/343,507

(22) Filed: Dec. 24, 2008

(65) Prior Publication Data
US 2010/0066392 A1 Mar. 18, 2010

Related U.S. Application Data

(63) Continuation-in-part of application No. 12/238,454, filed on Sep. 26, 2008, now abandoned, and a continuation-in-part of application No. 12/209,213, filed on Sep. 12, 2008, now Pat. No. 7,859,288.

(51) Int. Cl.
*G01R 31/02* (2006.01)
*G01R 27/08* (2006.01)
(52) U.S. Cl. ............................. 324/762.01; 324/762.02
(58) Field of Classification Search .................. None
See application file for complete search history.

(56) References Cited

U.S. PATENT DOCUMENTS

| | | | | |
|---|---|---|---|---|
| 6,342,790 | B1 * | 1/2002 | Ferguson et al. | 324/765 |
| 6,366,108 | B2 * | 4/2002 | O'Neill et al. | 324/763 |
| 7,161,354 | B2 * | 1/2007 | Takakamo et al. | 324/522 |
| 7,205,783 | B2 * | 4/2007 | Ito | 324/765 |
| 7,301,359 | B2 * | 11/2007 | Furukawa | 324/765 |
| 7,395,480 | B2 * | 7/2008 | Furukawa | 714/745 |
| 7,495,451 | B2 * | 2/2009 | Krouth et al. | 324/522 |

FOREIGN PATENT DOCUMENTS
JP 2006-317208 11/2006
* cited by examiner

*Primary Examiner* — Vinh P Nguyen
(74) *Attorney, Agent, or Firm* — Jianq Chyun IP Office

(57) ABSTRACT

A measurement apparatus that detects a defect in a device based on the quiescent current (IDDQ) of a CMOS LSI or the like detects the defect by measuring the value of IDDQ that flows when a logic vector is applied. However, the miniaturization of CMOS LSIs has caused an increase in the leak current flowing through a normal CMOS circuit. This makes it difficult to distinguish between the power supply current flowing in a defective CMOS circuit and the leak current flowing through a normal CMOS circuit. By applying the logic vector after suppressing the fluctuation of the leak current by controlling the power supply voltage applied to the device under measurement and the voltage applied to the substrate of the device under measurement, the measurement apparatus of the present invention can measure the power supply current flowing through a defective CMOS circuit to detect the defect in the CMOS circuit.

21 Claims, 14 Drawing Sheets

MEASUREMENT APPARATUS, TEST SYSTEM, AND MEASUREMENT METHOD FOR MEASURING A CHARACTERISTIC OF A DEVICE

CROSS REFERENCE TO RELATED APPLICATION

This is a continuation in-part application of U.S. Ser. No. 12/238,454 filed on Sep. 26, 2008, now abandoned and U.S. Ser. No. 12/209,213, filed on Sep. 12, 2008, now U.S. Pat. No. 7,859,288, the contents of which are incorporated herein by reference.

BACKGROUND

1. Technical Field

The present invention relates to a measurement apparatus, a test system, and a measurement method for measuring a characteristic of a device.

2. Related Art

A conventional measurement apparatus is known that detects a defect in a device based on the quiescent current (IDDQ) of a CMOS LSI or the like. The measurement apparatus uses the fact that the power supply current does not flow in the CMOS circuit, i.e. IDDQ≈0, when the transistor is at an unchanging state of rest, to detect a defect by measuring the IDDQ current flowing when each logic vector is applied. Such a measurement apparatus is shown in Japanese Patent Application Publication No. 2006-317208.

However, the miniaturization of CMOS LSIs has caused an increase in the leak current flowing through a normal CMOS circuit. This makes it difficult to distinguish between the power supply current flowing in a defective CMOS circuit (referred to hereinafter as the "defective current") and the leak current flowing through a normal CMOS circuit. Furthermore, the noise voltage generated by the power supply used in the measurement is converted into a noise current in the bypass capacitor connected to the device under measurement. Therefore, the defective current to be measured is buried in a noise current, so that the defective current cannot be accurately measured.

SUMMARY

Therefore, it is an object of an aspect of the innovations herein to provide a measurement apparatus, a test apparatus, and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary measurement apparatus may include a measurement apparatus that measures a device under measurement, including a voltage detecting section that detects a power supply voltage applied to the device under measurement; a voltage control section that suppresses a fluctuation of a leak current of the device under measurement caused by a fluctuation of the power supply voltage by controlling a substrate voltage of the device under measurement based on the power supply voltage detected by the voltage detecting section; and an IDDQ acquiring section that acquires a value of an IDDQ current of the device under measurement by measuring a prescribed characteristic of the device under measurement while the voltage control section suppresses the fluctuation of the leak current.

According to a second aspect related to the innovations herein, one exemplary test system may include a test system that tests a device under measurement, including a measurement apparatus that measures a value of an IDDQ current of the device under measurement; and a judging section that judges whether the device under measurement is defective based on the value of the IDDQ current measured by the measurement apparatus. The measurement apparatus includes a voltage detecting section that detects a power supply voltage applied to the device under measurement; a voltage control section that suppresses a fluctuation of a leak current of the device under measurement caused by a fluctuation of the power supply voltage by controlling a substrate voltage of the device under measurement based on the power supply voltage detected by the voltage detecting section; and an IDDQ acquiring section that acquires the value of the IDDQ current of the device under measurement by measuring a prescribed characteristic of the device under measurement while the voltage control section suppresses the fluctuation of the leak current.

According to a third aspect related to the innovations herein, one exemplary method may include a method for measuring a device under measurement, including detecting a power supply voltage applied to the device under measurement; suppressing a fluctuation of a leak current of the device under measurement caused by a fluctuation of the power supply voltage by controlling a substrate voltage of the device under measurement based on the detected power supply voltage; and acquiring a value of an IDDQ current of the device under measurement by measuring a prescribed characteristic of the device under measurement while the fluctuation of the leak current is suppressed.

According to a fourth aspect related to the innovations herein, one exemplary measurement apparatus may include a measurement apparatus that measures a device under measurement, comprising a power supply section that sequentially applies a first power supply voltage and a second power supply voltage to the device under measurement; a temperature control section that changes an ambient temperature of the device under measurement from a first temperature to a second temperature, according to the power supply section changing the power supply voltage applied to the device under measurement from the first power supply voltage to the second power supply voltage; a current measuring section that measures a first power supply current and a second power supply current, the first power supply current being supplied from the power supply section to the device under measurement when (i) the ambient temperature of the device under measurement is the first temperature and (ii) the power supply voltage applied to the device under measurement is the first power supply voltage, and the second power supply current being supplied from the power supply section to the device under measurement when (iii) the ambient temperature of the device under measurement is the second temperature and (iv) the power supply voltage applied to the device under measurement is the second power supply voltage; and an analyzing section that calculates an internal resistance value of the device under measurement based on the first power supply current and the second power supply current.

According to a fifth aspect related to the innovations herein, one exemplary test system may include a test system that tests a device under measurement, comprising a measurement apparatus that measures an internal resistance value of the device under measurement; and a judging section that judges whether the device under measurement is defective based on the internal resistance value measured by the measurement apparatus. The measurement apparatus includes a power supply section that sequentially applies a first power supply voltage and a second power supply voltage to the device under measurement; a temperature control section that changes an ambient temperature of the device under measurement from a first temperature to a second temperature, according to the power supply section changing the power supply voltage applied to the device under measurement from the first power supply voltage to the second power supply voltage; a current measuring section that measures a first power supply current and a second power supply current, the first power supply current being supplied from the power supply section to the device under measurement when (i) the ambient temperature of the device under measurement is the first temperature and (ii) the power supply voltage applied to the device under measurement is the first power supply voltage, and the second power supply current being supplied from the power supply section to the device under measurement when (iii) the ambient temperature of the device under measurement is the second temperature and (iv) the power supply voltage applied to the device under measurement is the second power supply voltage; and an analyzing section that calculates the internal resistance value of the device under measurement based on the first power supply current and the second power supply current.

According to a sixth aspect related to the innovations herein, one exemplary measurement method may include a method for measuring a device under measurement, comprising sequentially applying a first power supply voltage and a second power supply voltage to the device under measurement; changing an ambient temperature of the device under measurement from a first temperature to a second temperature, according a change in the power supply voltage applied to the device under measurement from the first power supply voltage to the second power supply voltage; measuring a first power supply current and a second power supply current, the first power supply current being supplied to the device under measurement when (i) the ambient temperature of the device under measurement is the first temperature and (ii) the power supply voltage applied to the device under measurement is the first power supply voltage, and the second power supply current being supplied to the device under measurement when (iii) the ambient temperature of the device under measurement is the second temperature and (iv) the power supply voltage applied to the device under measurement is the second power supply voltage; and calculating an internal resistance value of the device under measurement based on the first power supply current and the second power supply current.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
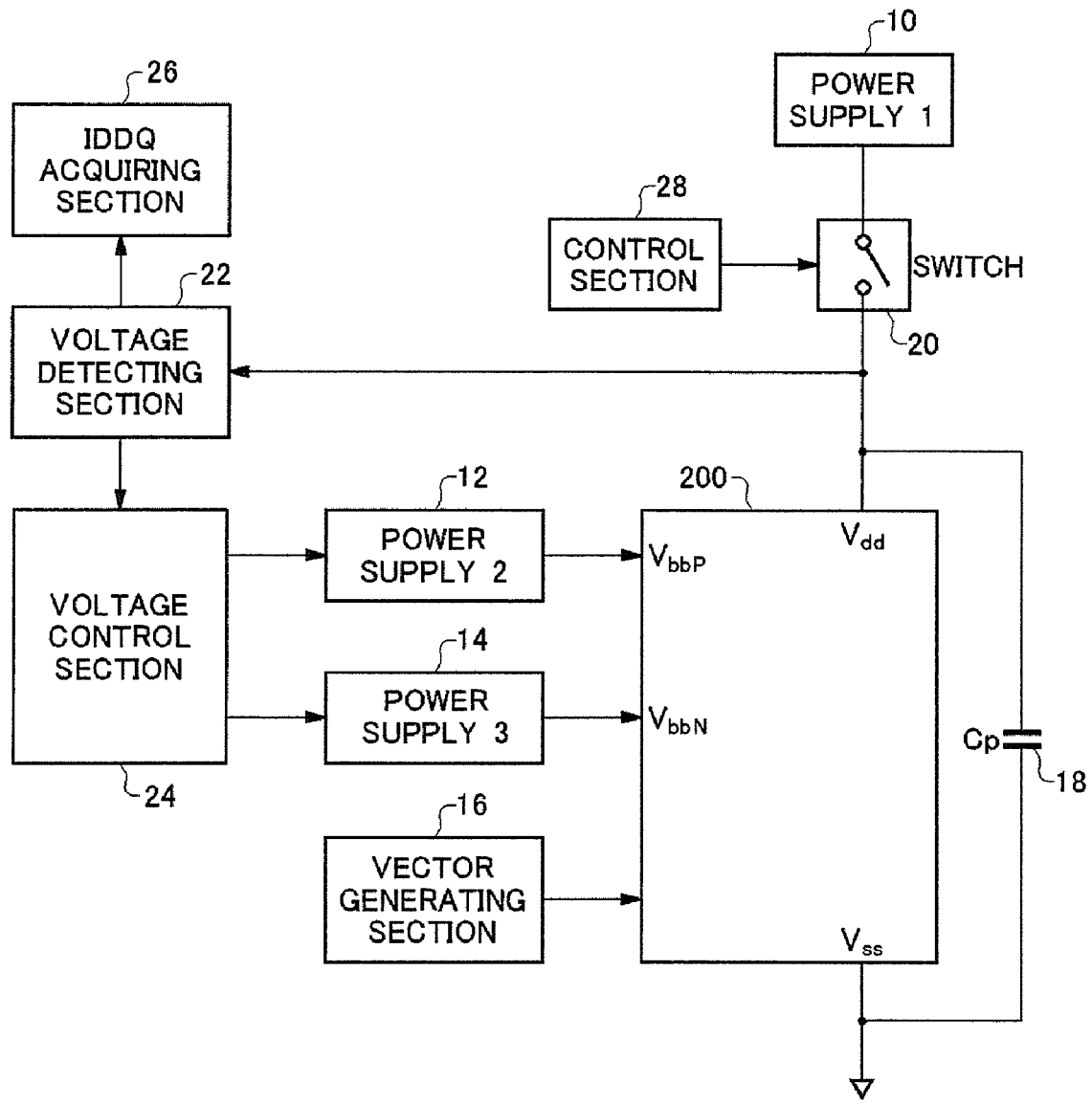
FIG. 1 shows an exemplary configuration of a measurement apparatus according to a first embodiment.

FIG. 1 shows an exemplary configuration of a measurement apparatus 100. The measurement apparatus 100 tests a device under measurement 200 having a CMOS circuit. The measurement apparatus 100 can accurately detect a defect by measuring the IDDQ while controlling the voltage applied to the device under measurement 200 such that the normal current flowing to the CMOS circuit is constant. The measurement apparatus 100 is provided with a first power supply 10, a second power supply 12, a third power supply 14, a vector generating section 16, a bypass capacitor 18, a switch 20, a voltage detecting section 22, a voltage control section 24, an IDDQ acquiring section 26, and a control section 28.

The first power supply 10 supplies power that drives an element of the CMOS or the like of the device under measurement 200. In the present embodiment, the first power supply 10 supplies the device under measurement 200 with a constant voltage. The second power supply 12 applies a voltage to a p-region, e.g. a p-well, of the device under measurement 200. The third power supply 14 applies a voltage to an n-region, e.g. an n-well, of the device under measurement 200.

The vector generating section 16 sequentially generates logic vectors for testing for a defect in the CMOS circuit of the device under measurement 200, and supplies the generated logic vectors to the device under measurement 200. More specifically, the vector generating section 16 causes the device under measurement 200 to be in different operational states by sequentially supplying the device under measurement 200 with different test patterns.

The bypass capacitor 18 is connected between a terminal Vdd, which is connected to the first power supply 10, and a terminal Vss that applies a reference voltage. In this way, even if the power consumed by the device under measurement 200 fluctuates, the current supplied to the device under measurement 200 can quickly follow the fluctuation. In the present embodiment, the terminal Vss is connected to a ground. The switch 20 is used to break the connection between the first power supply 10 and the device under measurement 200.

The voltage detecting section 22 detects the power supply voltage applied to the terminal Vdd of the device under measurement 200 and outputs the detection result to the voltage control section 24. The voltage control section 24 receives the power supply voltage detection result from the voltage detecting section 22 and controls the power supply voltage VbbP output by the second power supply and the power supply voltage VbbN output by the third power supply. The control section 28 controls the switch 20. The control section 28 may be configured as a microprocessor that operates according to a program.

Figure 2:
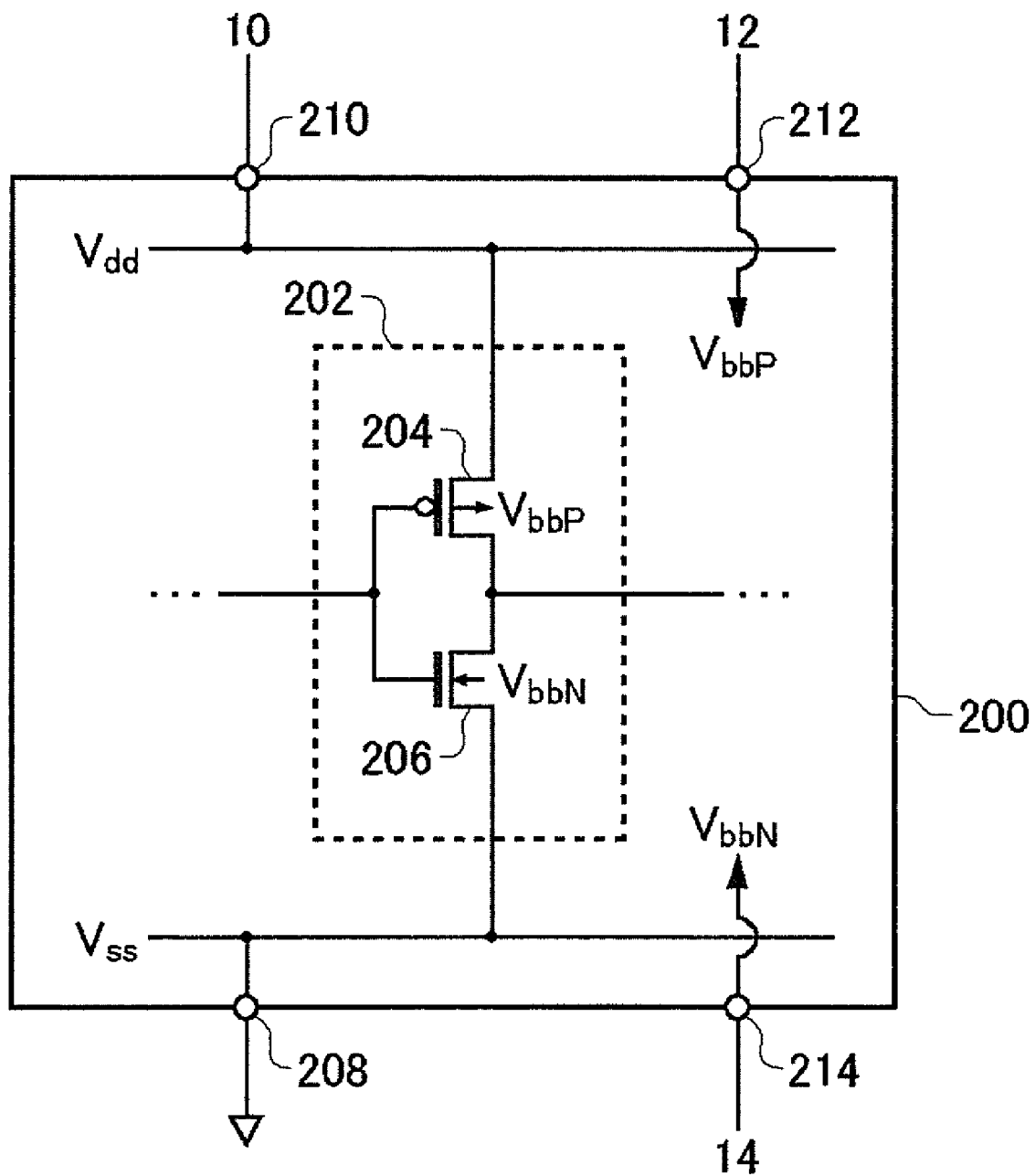
FIG. 2 shows an internal configuration of the device under measurement according to the first embodiment.

FIG. 2 shows an exemplary configuration of the device under measurement 200. The device under measurement 200 is provided with a circuit section under measurement 202 that operates according to the supplied logic vectors, power supply terminals 208 and 210, and substrate voltage terminals 212 and 214. The power supply voltage Vdd from the first power supply 10 is applied to the power supply terminal 210. The reference voltage Vss is applied to the power supply terminal 208. The power supply terminal 208 is grounded in the present embodiment.

The substrate voltage terminals 212 and 214 are provided independently from the power supply terminals 208 and 210. The voltage VbbP output by the second power supply 12 is applied to the substrate voltage terminal 212, and the voltage VbbN output by the third power supply 14 is applied to the substrate voltage terminal 214. Disposing the power supply terminals and the substrate voltage terminals independently in this way enables control of the substrate voltage of the device under measurement 200.

The circuit section under measurement 202 is provided between the Vdd power supply line and the Vss power supply line, and is supplied with the power supply power. The power supply voltage Vdd is applied to the Vdd power supply line via the power supply terminal 208. A voltage lower than that of the Vdd power supply line is supplied to the Vss power supply line. In the present embodiment, the Vss power supply line is grounded via the power supply terminal 208.

The circuit section under measurement 202 is provided with a plurality of p-FETs 204 and a plurality of n-FETs 206. The gate terminal of each of the plurality of FETs 204 and 206 is supplied with a signal corresponding to the logic vectors received from the device under measurement 200, and consumes the power supply current depending on the operational state.

Figure 3:
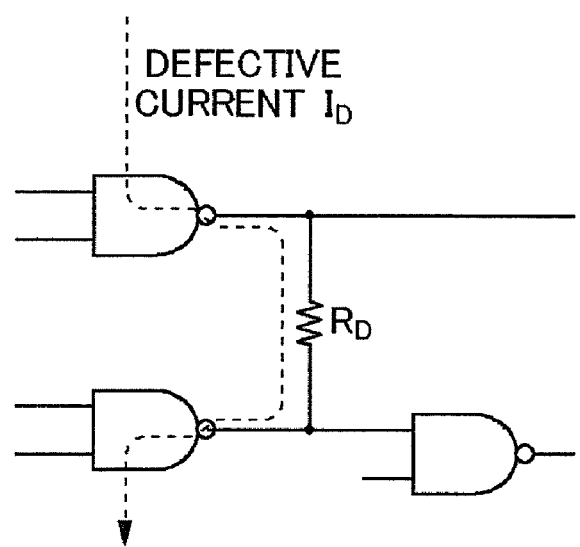
FIG. 3 is a schematic view of the device under measurement.

FIG. 3 is a schematic view of a defective current in the device under measurement 200, and shows an exemplary state in which a plurality of NAND gates are connected. In FIG. 3, $R_D$ represents a certain resistance value between the NAND gates, which is caused by a defect in the bridge connecting the internal signal lines. If such a bridge defect does not occur, the value of $R_D$ becomes infinitely large. If a bridge defect does occur, the defect current $I_D$ shown in FIG. 3 flows through the device under measurement 200. The value of the defect current $I_D$ is dependent on the power supply voltage Vdd and the resistance value $R_D$ of the resistance occurring between the signal lines due to the bridge defect. Accordingly, a defect can be detected from the internal resistance value $R_D$, which is obtained by differentiating the leak current flowing in a normal device under measurement 200 and the defective current flowing in a device under measurement 200 having a defective region.

Figure 4:
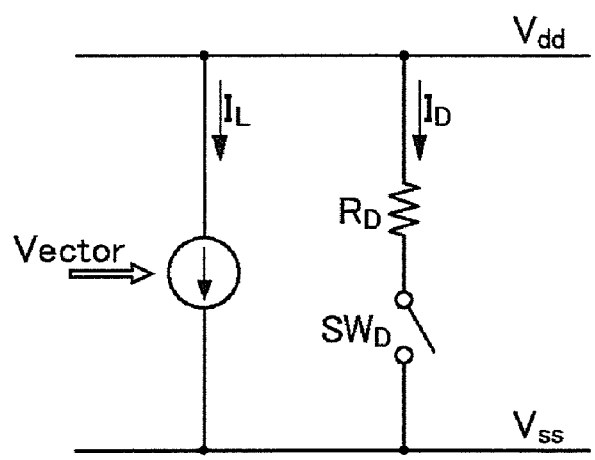
FIG. 4 is an equivalent circuit schematic of the device under measurement.

FIG. 4 is an equivalent circuit schematic in which the defect shown in FIG. 3 is present. In FIG. 4, $R_D$ represents the defective region, and $SW_D$ is a switch representing how the current flows when the prescribed logic vectors are applied. Furthermore, $I_L$ represents IDDQ when no defect is present, and $I_D$ represents the defective current value of the current flowing through the defective region.

The leak current in a device under measurement 200 without a defect can be obtained from Expression 1.

$$I_L = A(T,l) \cdot \exp\frac{V_{gs} - V_{th} - \gamma\left(\sqrt{2\psi - V_{bb}} - \sqrt{2\psi}\right) + \lambda V_{dd}}{S/\ln 10} \cdot$$

$$\underbrace{\left\{1 - \exp\left(-\frac{qV_{dd}}{kT}\right)\right\}}_{\approx 1}$$

Expression 1

In Expression 1, A(T,l) represents a correction coefficient dependent on the temperature T and a logic vector type l, Vgs represents the voltage at a gate-source junction, Vth represents a threshold voltage, γ represents a back bias effect coefficient, ψ represents a constant corresponding to a difference between an intrinsic Fermi level and a Fermi level of the substrate, λ represents a DIBL (Drain Induced Barrier Lowering) effect coefficient, S represents a threshold slope, Vbb represents the back bias voltage applied to the substrate, and Vdd represents the power supply voltage.

When the defect shown in FIG. 4 is present, the leak current can be obtained from Expression 2.

$$IDDQ = A(T,l) \cdot \exp$$

$$\frac{V_{gs} - V_{th} - \gamma\left(\sqrt{2\psi - V_{bb}} - \sqrt{2\psi}\right) + \lambda V_{dd}}{S/\ln 10} + \frac{V_{dd}}{R_D}$$

Expression 2

In Expression 2, the first term represents a sub-threshold leak current flowing through a normal device under measurement 200, and the second term represents the defective current. Since λ≈0 when the device under measurement 200 is manufactured according to a 0.18 μm design rule, the first term in Expression 2 is a constant value independent of Vdd. Since the infinitely large $R_D$ in a normal CMOS circuit causes the second term to equal zero, the IDDQ is a constant value calculated from the first term of Expression 2.

On the other hand, since $R_D$ is not infinitely large when a defect is present in the CMOS circuit, IDDQ changes according to a change in Vdd. The amount of change of IDDQ is equal to an amount obtained by dividing Vdd by $R_D$. In other words, the resistance value of $R_D$ can be obtained by measuring the amount of change of IDDQ when Vdd changes. As a result, a defect can be judged to be present if the resistance value of $R_D$ is less than a predetermined value. It should be noted that λ≠0 when the device under measurement 200 is manufactured according to a design rule of less than or equal to 0.1 μm. Accordingly, the first term, the second term, and the third term of Expression 2 all depend on Vdd, so that the resistance value of the defective region cannot be detected by measuring the amount of change of IDDQ when Vdd changes.

If Vbb is controlled such that the first term in Expression 2 becomes a constant, Expression 3 can be obtained.

$$\gamma(\sqrt{2\psi - V_{bb}} - \sqrt{2\psi}) = \lambda V_{dd} \qquad \text{Expression 3}$$

In this case, IDDQ can be obtained from Expression 4.

$$IDDQ = A(T, l) \cdot \exp\frac{V_{gs} - V_{th}}{S/\ln 10} + \frac{V_{dd}}{R_D} \qquad \text{Expression 4}$$

As a result, the defect can be detected by measuring the amount of change of IDDQ when Vdd changes, in the same manner as when $\lambda \approx 0$.

Figure 5:
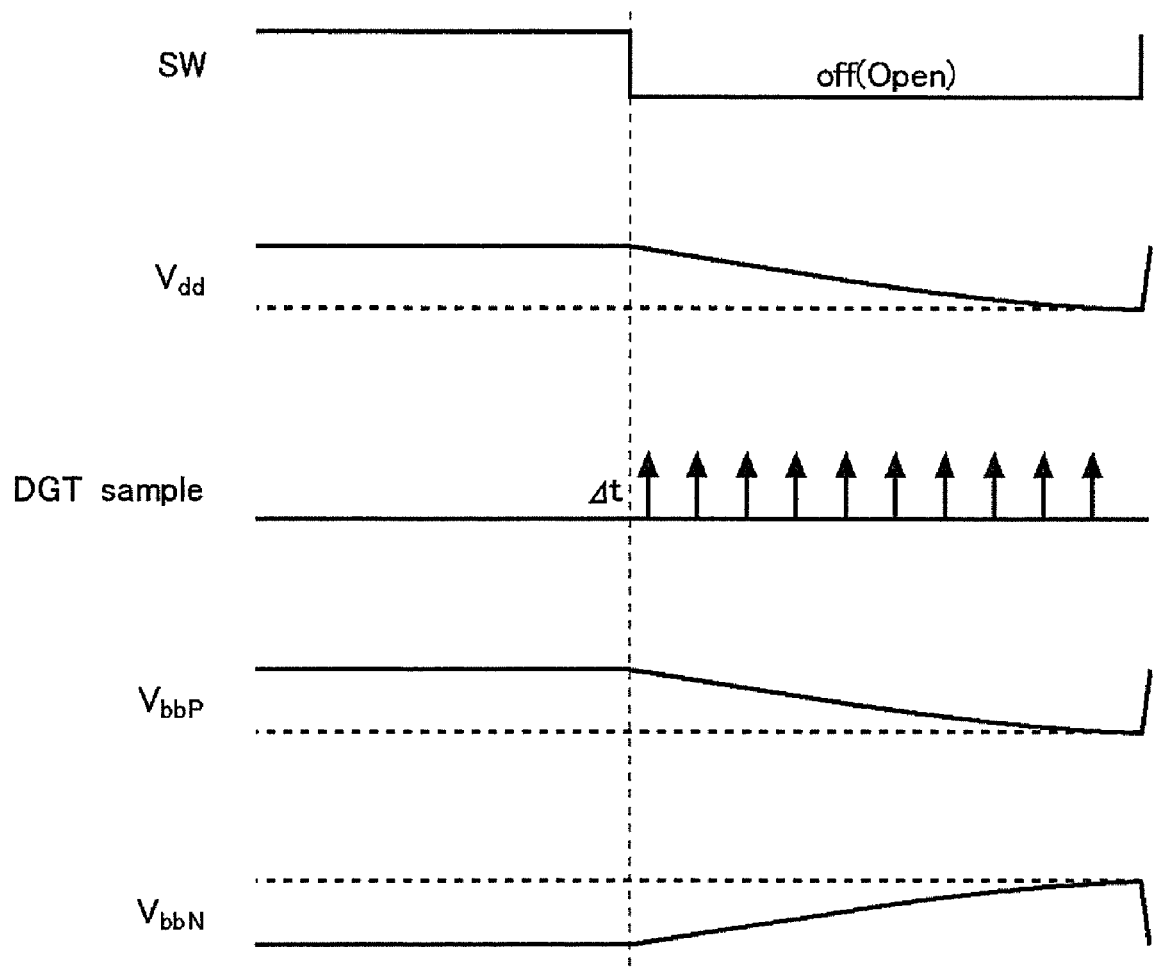
FIG. 5 shows a sequence of measurements according to the first embodiment.

The following describes a process for detecting a defect in the device under measurement 200 using the method described above. FIG. 5 is a sequence diagram showing a relation between each part of the voltage waveform and the voltage detection timing, according to the control described in the first embodiment. In FIG. 5, SW represents the state of the switch 20, off(Open) represents the period during which the switch 20 is open, and Vdd, VbbP, and VbbN each represent the voltage of a corresponding terminal. Furthermore, DGTsample represents the voltage detecting section 22 sampling the value of Vdd at intervals of $\Delta t$ to detect Vdd.

Figure 6:
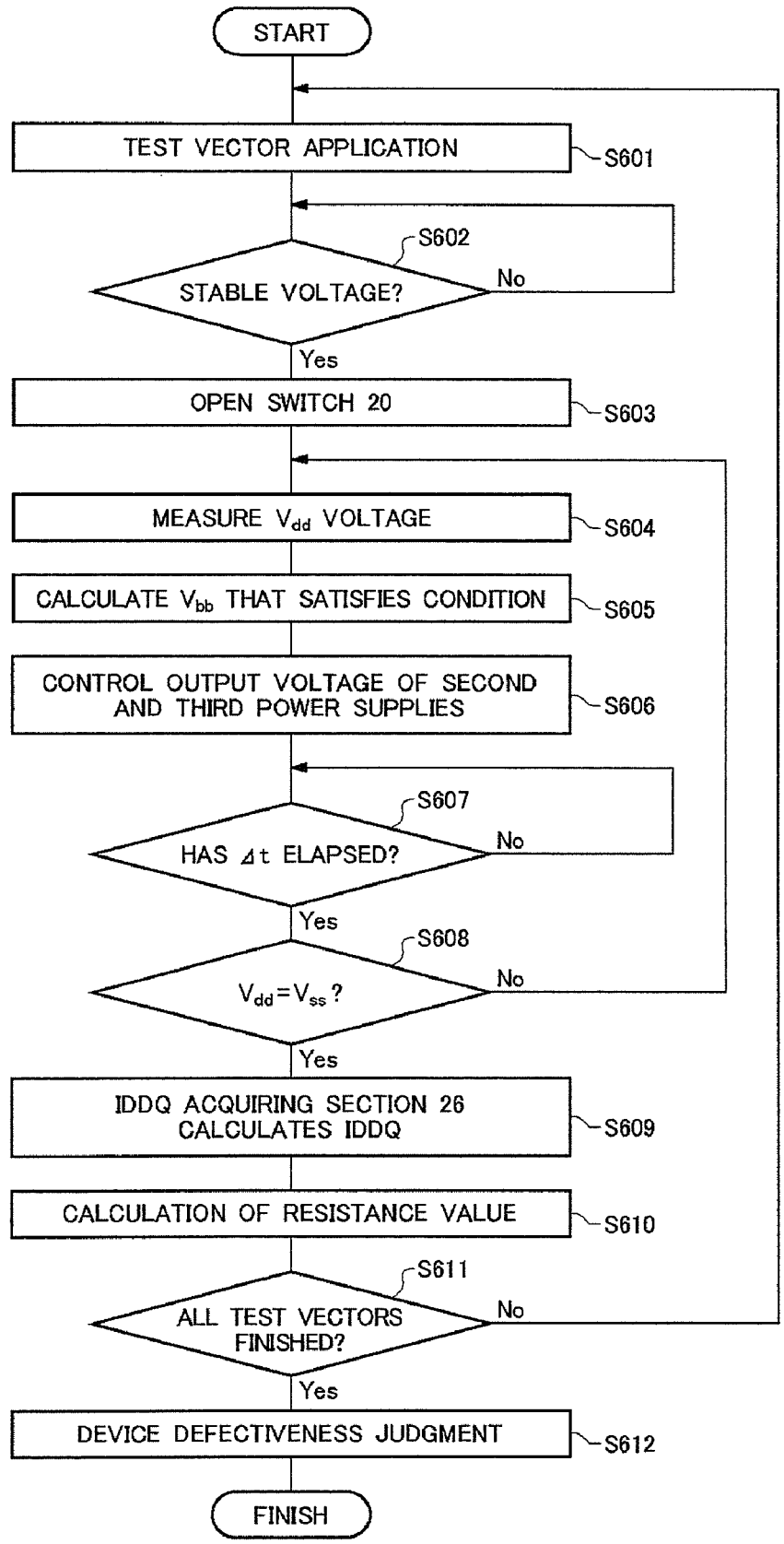
FIG. 6 is a process flow chart of the measurement according to the first embodiment.

FIG. 6 is a process flow chart of the control performed in the first embodiment. The operation of the first embodiment is described using FIG. 6. When the measurement apparatus 100 begins testing the device under measurement 200, the vector generating section 16 generates vectors that change the logic state of the device under measurement 200, and applies these generated logic vectors to the device under measurement 200 (S601). After a prescribed time has passed from when the vector generating section 16 applied the logic vectors to the device under measurement 200, the device under measurement 200 enters into a stabilized state (S602). At this time, the control section 28 opens the switch 20 to separate the first power supply 10 from the Vdd terminal of the device under measurement 200 (S603). When the first power supply 10 is separated from the Vdd terminal of the device under measurement 200, the leak current begins to flow, causing a discharge from the bypass capacitor 18 connected to Vdd, so that the value of Vdd gradually drops as shown in FIG. 5.

The voltage detecting section 22 detects the decreasing power supply voltage of Vdd (S604) and outputs the detection result to the voltage control section 24 and the IDDQ acquiring section 26. The voltage control section 24 calculates the value of Vbb by substituting the value of Vdd detected by the voltage detecting section 22 into Expression 3 (S605). The voltage control section 24 then controls the substrate voltage of the device under measurement 200. More specifically, the voltage control section 24 controls the second power supply 12 and the third power supply 14 such that the calculated Vbb is applied to the VbbP terminal and the VbbN terminal of the device under measurement 200 (S606). In this way, the measurement apparatus 100 can keep the sub-threshold leak current of the device under measurement 200 constant, even as Vdd decreases. The measurement apparatus 100 repeats the processes from S604 to S606 at time intervals of $\Delta t$ (S607) until the voltage Vdd is equal to the voltage Vss (S608). The prescribed voltage is less than an initial value of Vdd, and is greater than Vss. For example, the prescribed voltage may be approximately 0.6 V.

When the voltage control section 24 controls Vdd, VbbP, and VbbN in a manner to satisfy Expression 3 using the above processes, the first term of Expression 2 is constant. As a result, the sub-threshold leak current is kept constant, so that IDDQ is equal to the value shown by Expression 4. Since the value $R_D$ is infinitely large when there is no defect in the CMOS circuit, the second term of Expression 4 is zero, so that the IDDQ is kept constant. But since the value $R_D$ is not infinitely large when there is a defect in the CMOS circuit, IDDQ changes according to a change in Vdd. The amount of change of IDDQ is equal to a value obtained by dividing the amount of change of Vdd by $R_D$. Accordingly, the measurement apparatus 100 can obtain the resistance value of $R_D$ by measuring the amount of change of IDDQ when Vdd is changed.

For example, the IDDQ acquiring section 26 can obtain the value of the IDDQ current based on the discharge speed of the bypass capacitor from when the first power supply 10 is separated from the Vdd terminal. More specifically, the IDDQ acquiring section 26 can obtain the IDDQ(t1) at timing t1 using Expression 5.

$$Cp \times \Delta Vdd(t1) = IDDQ(t1) \times \Delta t \qquad \text{Expression 5}$$

Here, the difference value $\Delta Vdd(t1)$ represents a difference between the voltage Vdd(t1) input from the voltage detecting section 22 and the voltage Vdd(t1−$\Delta t$) input at a timing $\Delta t$ earlier than t1.

In other words, the IDDQ acquiring section 26 can obtain the value of the IDDQ current by dividing (i) the product of the capacitance CP of the bypass capacitor and the voltage difference $\Delta Vdd(t)$ of the bypass capacitor by (ii) the timing difference $\Delta t$ between measurements of the voltage of the bypass capacitor (S609). By measuring a characteristic of the device under measurement 200 while the voltage control section 24 controls the fluctuation of the leak current in this way, the measurement apparatus 100 can obtain IDDQ of the device under measurement 200. For example, if Cp=100 μF, $\Delta t$=10 μsec, and $\Delta Vdd(t1)$=5 mV, then IDDQ(t1)=50 mA.

The IDDQ acquiring section 26 desirably calculates IDDQ (t1) and IDDQ(t2) at the timings t1 and t2 of at least two different Vdd voltages, in order to calculate the resistance value $R_D$ of the defective region. The following describes a method for calculating $R_D$ that uses Vdd and IDDQ values measured at two different timings.

The voltage control section 24 controls Vdd, VbbP, and VbbN such that IDDQ is equal to Expression 4. If there is no defect, $R_D$ is infinitely large, so that the second term of Expression 4 is zero and IDDQ(t1)=IDDQ(t2). On the other hand, Expression 6 is reached if IDDQ(t1)≠IDDQ(t2).

$$IDDQ(t1) - IDDQ(t2) = \{Vdd(t1) - Vdd(t2)\}/R_D \qquad \text{Expression 6}$$

Accordingly, the resistance value of the defective region can be calculated using Expression 7.

$$R_D = \{Vdd(t1) - Vdd(t2)\}/\{IDDQ(t1) - IDDQ(t2)\} \qquad \text{Expression 7}$$

In other words, the measurement apparatus 100 can calculate the resistance value of $R_D$ by measuring the Vdd voltage corresponding to the voltage of the bypass capacitor at at least two different timings (S608).

The measurement apparatus 100 performs the above measurement and calculation for each logic vector until all logic vectors have been applied (S611). The measurement apparatus 100 judges that there is a defect when a calculated resistance value is less than a prescribed resistance value, which is determined for each logic vector (S612).

During measurement, the measurement apparatus 100 separates the first power supply 10 from the device under measurement 200 to enable precise measurement without being affected by noise superimposed by the output of the first power supply 10. In addition to measuring IDDQ at intervals of $\Delta t$ and calculating the resistance values, an average value of the resistance values may be set as the resistance value of the defective region when a defect-detecting logic vector is used, in order to increase the accuracy of the measurement. Furthermore, instead of judging whether a defect is present after all the logic vectors have been applied, this judgment may be made as soon as a resistance value less than or equal to a prescribed value is calculated.

The measurement apparatus 100 is provided with the bypass capacitor 18 in the above description, but the bypass capacitor 18 may be provided to the device under measurement 200 instead. Instead of opening the switch 20 after a predetermined time has passed since a logic vector was applied to the device under measurement 200, the measurement apparatus 100 may observe the current value of IDDQ or the voltage value of Vdd and open the switch 20 as soon the value of IDDQ or Vdd falls inside a predetermined range. Furthermore, the measurement apparatus 100 may directly measure the current discharged from the bypass capacitor 18.

Figure 7:
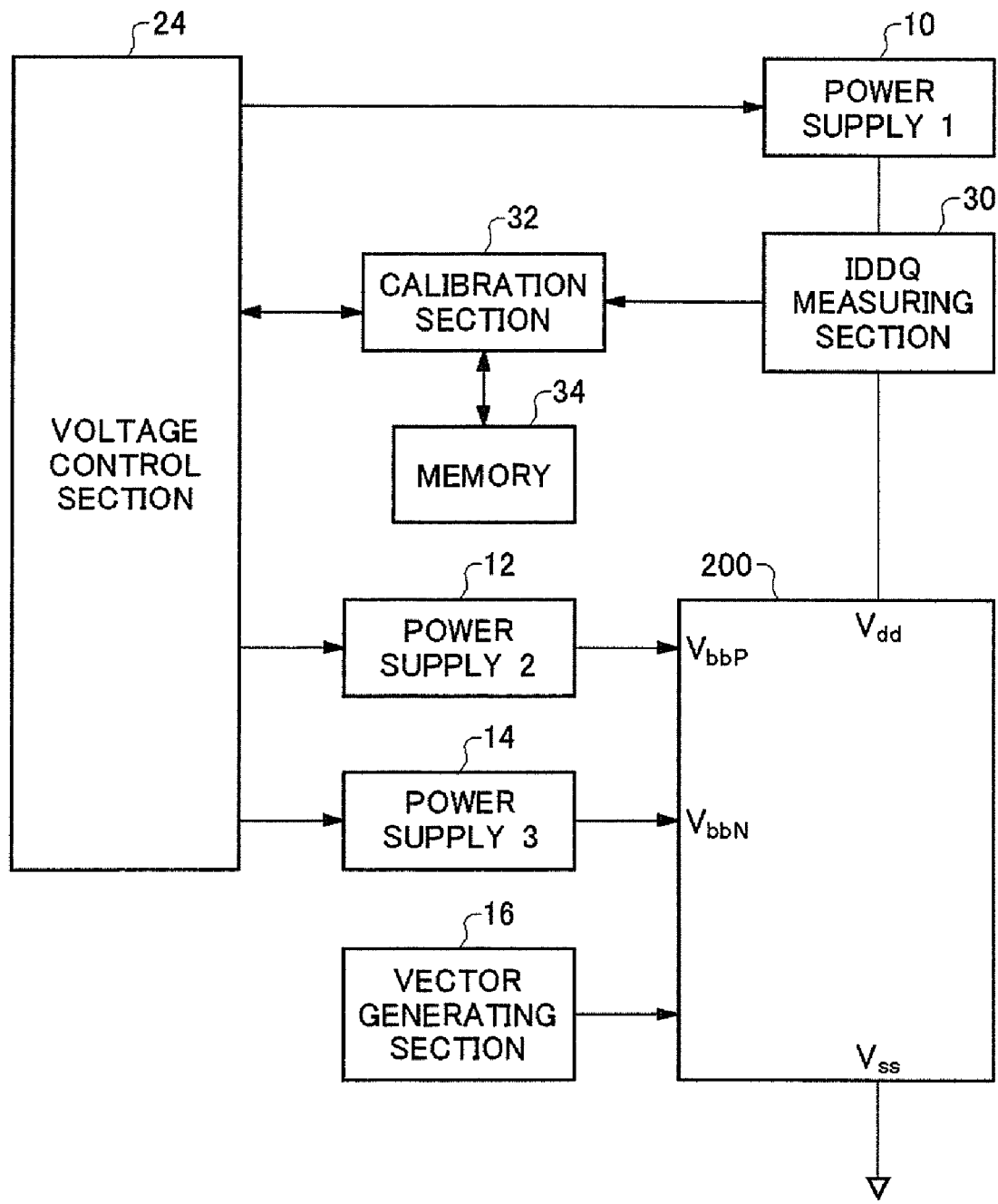
FIG. 7 shows a configuration of the measurement apparatus according to the second embodiment.

FIG. 7 shows a second exemplary configuration of the measurement apparatus 100 that tests the device under measurement 200. The measurement apparatus 100 of the present embodiment tests the device under measurement 200 provided with the CMOS circuit. The measurement apparatus 100 includes the first power supply 10, the second power supply 12, the third power supply 14, the vector generating section 16, the voltage control section 24, an IDDQ measuring section 30, a calibration section 32, and a memory 34.

The first power supply 10, the second power supply 12, and the third power supply 14 have the same function as the first power supply 10, the second power supply 12, and the third power supply 14 described in relation to FIG. 1, and supply power to the Vdd terminal, the VbbP terminal, and the VbbN terminal of the device under measurement 200, respectively. In the present embodiment, however, the switch is not provided between the first power supply 10 and the device under measurement 200, so that the first power supply 10 is always connected to the device under measurement 200.

The vector generating section 16 functions in the same manner as the vector generating section 16 described in FIG. 1. The vector generating section 16 supplies the device under measurement 200 with the logic vectors that set different logic states for the device under measurement 200, while the first power supply 10, the second power supply 12, and the third power supply 14 are connected to the Vdd terminal, the VbbP terminal, and the VbbN terminal of the device under measurement 200, respectively.

The voltage control section 24 is different from the voltage control section 24 described in FIG. 1, in that the voltage control section 24 of the present embodiment is not connected to the voltage detecting section 22, and therefore does not receive the detected values of the Vdd voltage. The voltage control section 24 of the present embodiment references a table, which is stored in the memory 34, indicating the correspondence between Vdd, VbbP, and VbbN, and outputs information concerning the desired output voltage to the first power supply 10, the second power supply 12, and the third power supply 14. The first power supply 10, the second power supply 12, and the third power supply 14 output voltages according to the values received from the voltage control section 24 to the Vdd terminal, the VbbP terminal, and the VbbN terminal, respectively.

Figure 8:
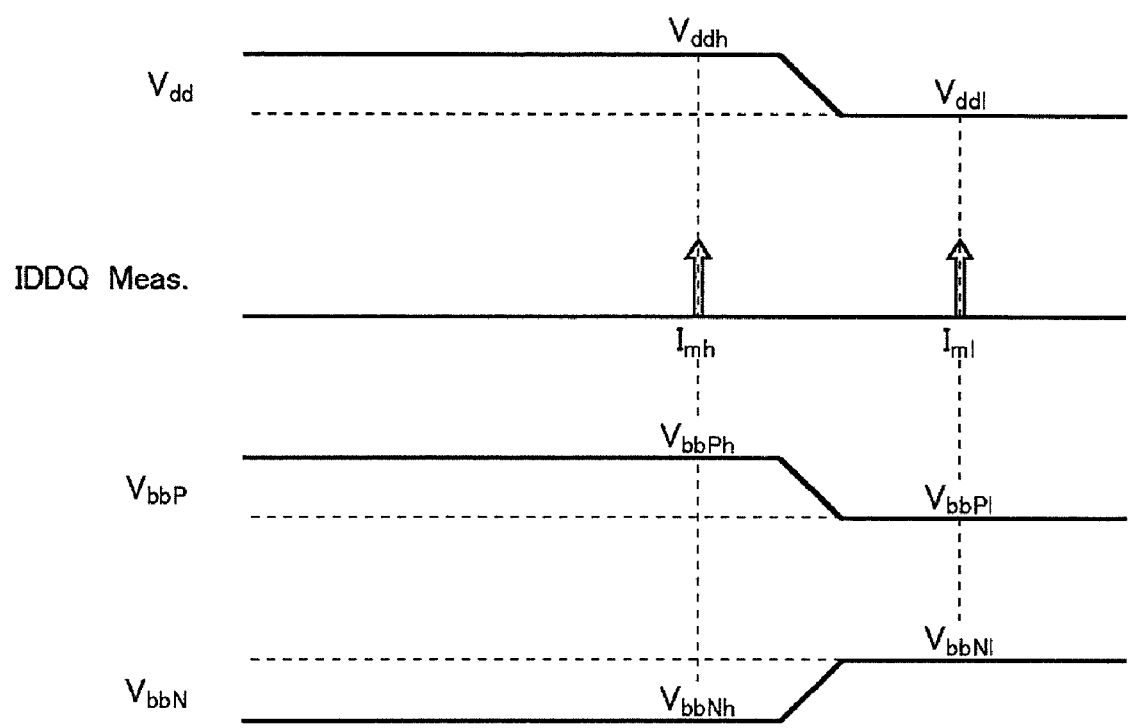
FIG. 8 shows a sequence of measurements according to the second embodiment.

FIG. 8 is a sequence diagram showing a relation between each part of the voltage waveform and the voltage detection timing, according to the control described in the second embodiment. In FIG. 8, Vdd, VbbP, and VbbN each represent the voltage of a corresponding terminal. Furthermore, IDDQ Meas. represents the timing at which the IDDQ measuring section 30 measures IDDQ, Imh indicates the value of IDDQ measured when the Vdd voltage is Vddh, and Iml indicates the value of IDDQ measured when the Vdd voltage is Vddl.

Figure 9:
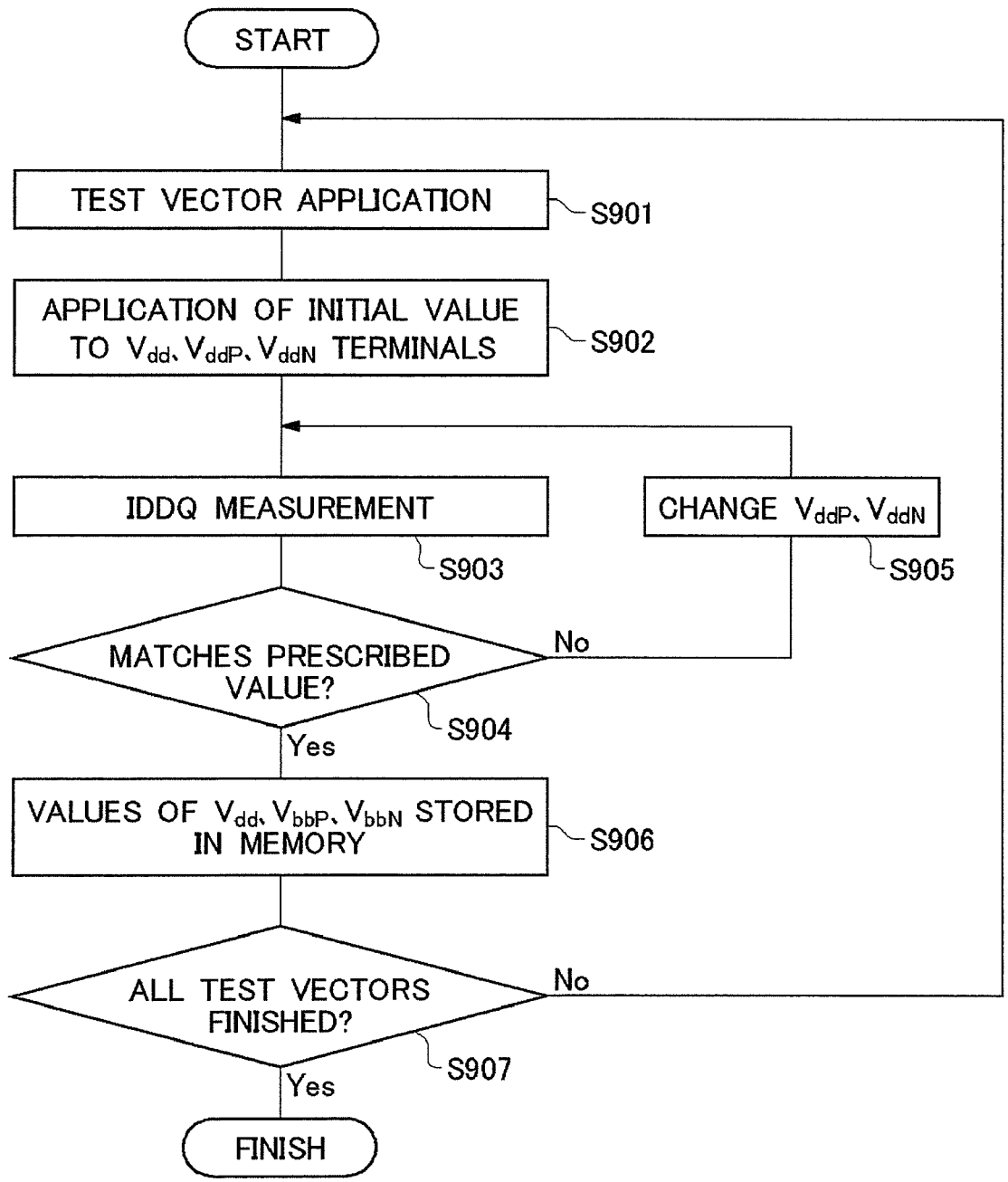
FIG. 9 is a flow chart showing the calibration process according to the second embodiment.

FIG. 9 is a flow chart showing the measurement apparatus 100 performing the calibration process of Vdd, VbbP, and VbbN corresponding to each logic vector. During calibration, the measurement apparatus 100 measures a device under measurement 200 that has been judged to be defect-free.

First, the vector generating section 16 applies the prescribed logic vector to the device under measurement 200 (S901). The voltage control section 24 controls the first power supply 10, the second power supply 12, and the third power supply 14 to apply an initial voltage value to the Vdd terminal, the VbbP terminal, and the VbbN terminal (S902). In this state, the IDDQ measuring section 30 measures the value of IDDQ flowing through the device under measurement 200 and outputs the measured IDDQ value to the calibration section 32 (S903).

The calibration section 32 judges whether the difference between the value of the input IDDQ and the value of the first term of Expression 2 is within a prescribed range. Since the current in the second term of Expression 2 is equal to zero when the device under measurement 200 does not have a defect, the calibration section 32 may make the judgment concerning the presence of a defect based solely on the first term of Expression 2.

If the difference between the value of IDDQ and the value of the first term of Expression 2 is greater than or equal to a prescribed amount (S904), the relation between Vdd and Vbb does not satisfy Expression 3. Accordingly, the calibration section 32 instructs the voltage control section 24 to change the substrate voltages VbbP and VbbN (S905). The calibration section 32 repeats this process until the value of IDDQ is equal to the value of the first term of Expression 2. When the value of IDDQ is equal to the value of the first term of Expression 2, the values of Vdd, VbbP, and VbbN at this time are stored in the memory 34 (S906).

The calibration section 32 decreases the Vdd voltage by a prescribed amount (S908) and repeats the processes from S902 to S907. By repeating these processes until the Vdd voltage is substantially equal to the Vss voltage, the calibration section 32 can obtain the amount of change in the substrate voltages VbbP and VbbN based on the amount of change of the power supply voltage Vdd.

Since the first term of Expression 2 is different for each logic vector, the calibration section 32 obtains the values of Vdd, VbbP, and VbbN as described above for each logic vector, and stores these values in the memory 34 in association with the type of logic vector. After obtaining values of Vdd, VbbP, and VbbN for each logic vector that causes the value of IDDQ to be equal to the value of the first term in Expression 2, the calibration is finished (S907).

In the manner described above, with the first power supply 10 being connected to the power supply terminal Vdd, the calibration section 32 can detect the substrate voltages VbbP and VbbN that cause IDDQ flowing to the Vdd terminal to be a prescribed value when the power supply voltage applied to the power supply terminal by the first power supply 10 is changed. The processes from S902 to S907 should be performed for at least two different voltage values of Vdd. For example, calibration is performed for Vddh and Vddl, as shown in FIG. 8.

The measurement apparatus 100 can use various other methods to increase the calibration precision. For example, the measurement apparatus 100 may select a device that has been judged to be defect-free using verification logic vectors, which have many more types than measurement logic vectors. The measurement logic vectors may be applied to the device and the values of Vdd, VbbP, and VbbN corresponding to each logic vector may be stored in the memory 34.

The measurement apparatus 100 may read values calculated by simulating the values of Vdd, VbbP, and VbbN when each logic vector is applied to a defect-free device, and store the ratio of these values in the memory 34. The measurement apparatus 100 may read the values of Vdd, VbbP, and VbbN measured during manufacturing of the device, calculate the values of Vdd, VbbP, and VbbN used in actual the measurement based on a statistical distribution of the read values, and store the calculated values in the memory 34.

Instead of storing the values of Vdd, VbbP, and VbbN in the memory 34, the amount of change of Vdd can be stored in the memory 34 in association with the amounts of change of VbbP and VbbN. The memory 34 desirably uses a non-volatile memory so that the data remains when the power supply of the measurement apparatus is turned off.

Figure 10:
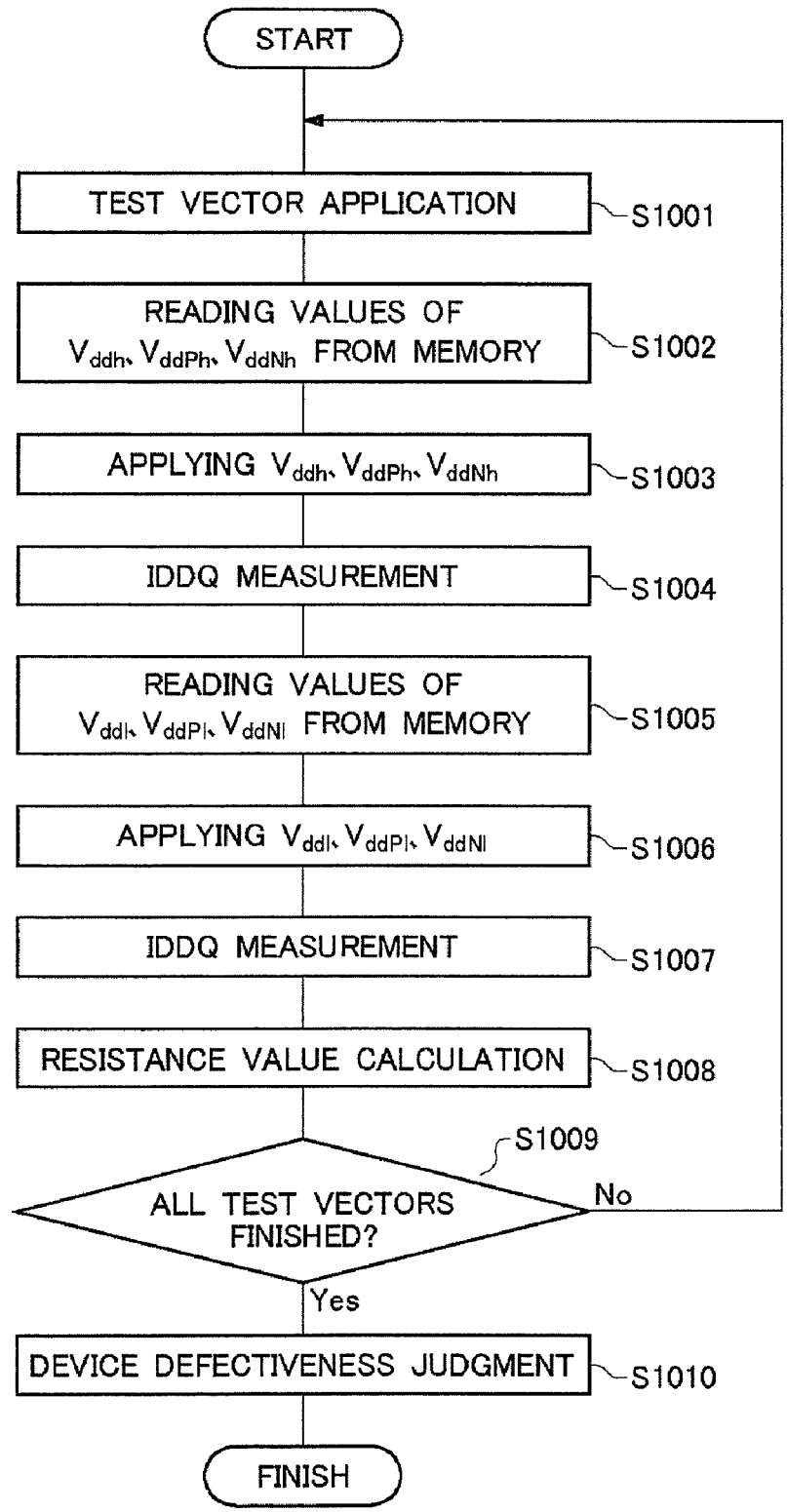
FIG. 10 is a flow chart showing the measurement process according to the second embodiment.

FIG. 10 is a flow chart showing the process by which the measurement apparatus 100 measures the device under measurement 200. When the measurement apparatus 100 begins measuring the device under measurement 200, the vector generating section 16 generates vectors causing different logic states and applies the generated logic vectors to the device under measurement 200 (S1001). The voltage control section 24 reads the values of Vdd, VbbP, and VbbN to be set for each applied logic vector from the memory 34 via the calibration section 32.

For example, the voltage control section 24 reads, from the memory 34, the values of a first set of Vdd, VbbP, and VbbN values, which are Vddh, VbbPh, and VbbNh (S1002). The voltage control section 24 then controls the first power supply 10, the second power supply 12, and the third power supply 14 to apply the voltage indicated by the above values to the device under measurement 200 (S1003). In this state, the IDDQ measuring section 30 measures IDDQ and stores the measured IDDQ value, i.e. Imh, in an internal register (S1004).

The voltage control section 24 reads, from the memory 34, the values of a second set of Vdd, VbbP, and VbbN values, which are Vddl, VbbPl, and VbbNl (S1005). The voltage control section 24 then controls the first power supply 10, the second power supply 12, and the third power supply 14 to apply the voltage indicated by the above values to the device under measurement 200 (S1006). In this state, the IDDQ measuring section 30 measures IDDQ and stores the measured IDDQ value, i.e. Iml, in an internal register (S1007).

Here, Vddh, VbbPh, VbbNh, Vddl, VbbPl, and VbbNl are voltage values that the calibration section 32 calculates through the calibration process flow shown in FIG. 9. Accordingly, if there is no defect in the device under measurement 200, the value of Imh obtained when Vddh, VbbPh, and VbbNh, are applied is equal to the value of Iml obtained when Vddl, VbbPl, and VbbNl are applied. On the other hand, if Imh is not equal to Iml, the difference between Imh and Iml corresponds to the difference between the corresponding second terms of Expression 4, which is shown in Expression 8.

$$Imh-Iml=Vddh/R_D-Vddl/R_D \qquad \text{Expression 8}$$

Accordingly, the IDDQ measuring section 30 can calculate the resistance value of $R_D$ using Expression 9 (S1008).

$$R_D=(Vddh-Vddl)/(Imh-Iml) \qquad \text{Expression 9}$$

After calculating the resistance value of the defective region using the above processes, the measurement apparatus 100 judges whether there is a defect in the device under measurement 200, in the same manner as described in the first embodiment (S1010). For example, the measurement apparatus 100 judges that there is a defect if the calculated resistance value is smaller than a prescribed resistance value, which is determined in advance for each logic vector.

Figure 11:
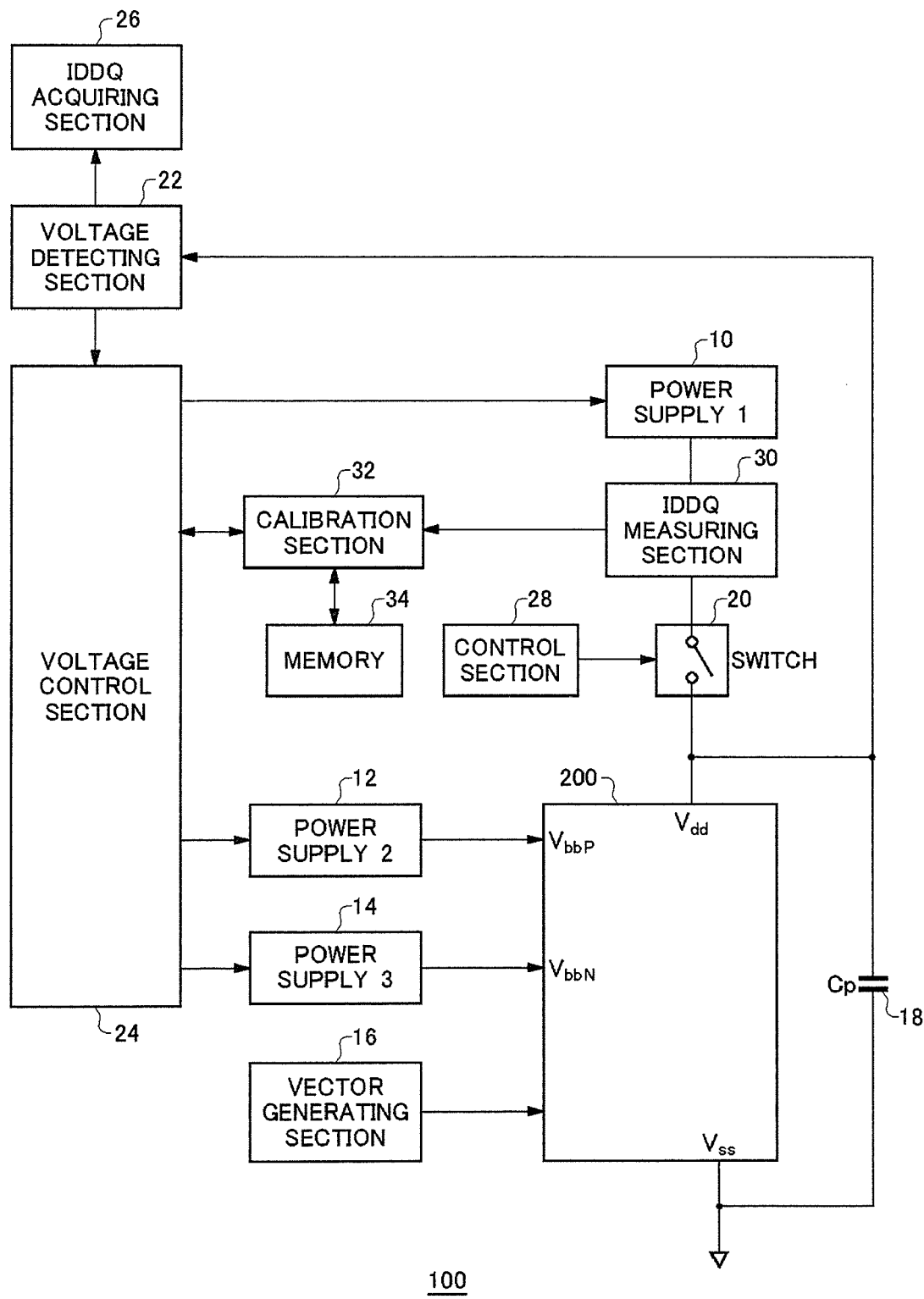
FIG. 11 shows a configuration of the measurement apparatus according to a third embodiment.

FIG. 11 shows a third exemplary configuration of the measurement apparatus 100 that tests the device under measurement 200. The measurement apparatus 100 of the present embodiment tests the device under measurement 200 provided with the CMOS circuit. The measurement apparatus 100 includes the first power supply 10, the second power supply 12, the third power supply 14, the vector generating section 16, the bypass capacitor 18, the switch 20, the voltage detecting section 22, the voltage control section 24, the IDDQ acquiring section 26, the control section 28, the IDDQ measuring section 30, the calibration section 32, and the memory 34.

In the measurement apparatus 100, the calibration section 32 uses the method described in the second embodiment to perform calibration using a device under measurement 200 that is judged to be defect-free. The calibration section 32 stores the calibrated values of Vdd, VbbP, and VbbN in the memory 34 in association with the type of logic vector.

When the measurement apparatus 100 measures whether a defective region is present in the device under measurement 200, the control section 28 opens the switch 20 after a prescribed time has passed since the vector generating section 16 applied a logic vector to the device under measurement 200. When the control section 28 opens the switch 20, the bypass capacitor 18 begins to discharge so that the voltage at the Vdd terminal gradually decreases, as shown in FIG. 5.

While the voltage at the Vdd terminal is decreasing, the voltage detecting section 22 detects the voltage at the Vdd terminal at intervals of Δt. The voltage detecting section 22 then references a table, which shows the correspondence between Vdd, VbbP, and VbbN, stored in the memory 34 via the calibration section 32. Based on this reference table, the voltage detecting section 22 selects the values of VbbP and VbbN corresponding to the detected voltage at the Vdd terminal, and controls the second power supply 12 and the third power supply 14 such that the voltage equal to the selected VbbP and VbbN is applied to the device under measurement 200.

The measurement apparatus 100 repeats this process at timing intervals of Δt until the Vdd voltage is equal to the Vss voltage. If IDDQ(t) is calculated at at least two different timings, the resistance value of the defective region can be calculated by substituting the IDDQ values and Vdd values obtained at the at least two timings into Expression 7.

The measurement apparatus 100 performs the above measurements and calculations for each logic vector until all of the logic vectors have been applied. A defect may be judged to exist if a calculated resistance value is less than a prescribed resistance value determined for the corresponding logic vector.

Figure 12:
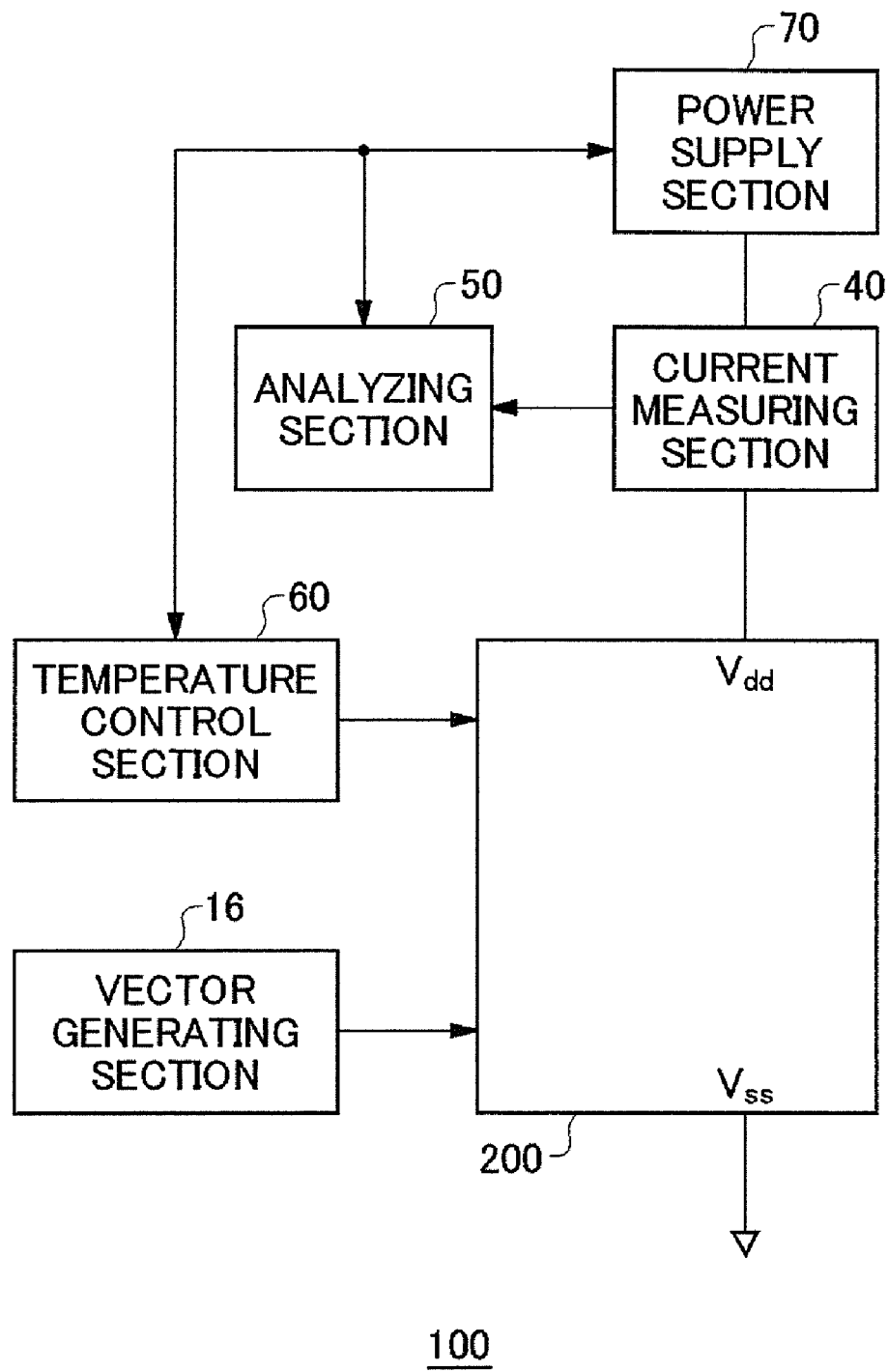
FIG. 12 shows an exemplary configuration of the measurement apparatus according to a fourth embodiment.

FIG. 12 shows an exemplary configuration of the measurement apparatus according to a fourth embodiment. The measurement apparatuses 100 according to the first to third embodiments suppress the fluctuation of the leak current caused by the fluctuation of the power supply voltage supplied to the device under measurement 200 by dynamically controlling the substrate voltage Vbb of the device under measurement 200. However, it is sometimes difficult to control the substrate voltage of the device under measurement 200.

The measurement apparatus 100 of the present embodiment suppresses the fluctuation of the leak current caused by the fluctuation of the power supply voltage supplied to the device under measurement 200 by changing the ambient temperature of the device under measurement 200. The measurement apparatus 100 of the present embodiment tests the device under measurement 200 provided with a CMOS circuit, and includes a power supply section 70, a current measuring section 40, an analyzing section 50, a temperature control section 60, and the vector generating section 16.

The power supply section 70 supplies power that drives the elements, e.g. the CMOS circuit, of the device under measurement 200. The power supply section 70 sequentially applies a first power supply voltage and a second power supply voltage to the device under measurement 200, so that the current measuring section 40 can measure the power supply current when each of these different power supply voltages are applied to the device under measurement 200.

The temperature control section 60 changes the ambient temperature of the device under measurement 200 from a first temperature to a second temperature, according to the power supply section 70 changing the power supply voltage applied to the device under measurement 200 from the first power supply voltage to the second power supply voltage. For example, the temperature control section 60 may change the temperature in an internal chamber of the device under measurement 200 from the first temperature to the second temperature. Instead, the power supply section 70 may change the output power supply voltage according to the temperature control section 60 changing the ambient temperature of the device under measurement 200.

The power supply section 70 and the temperature control section 60 desirably control the power supply voltage and the ambient temperature of the device under measurement 200 such that the change of the leak current of the device under measurement 200 caused by the change of the power supply voltage applied to the device under measurement 200 is cancelled out by the change of the leak current of the device under measurement 200 caused by the change in the ambient temperature of the device under measurement 200. For example, if the first power supply voltage and the second power supply voltage output by the power supply section 70 are set in advance by a user, the temperature control section 60 may control the ambient temperature of the device under measurement 200 according a change between the first power supply voltage and the second power supply voltage.

If the first temperature and the second temperature are set in advance by the user, the power supply section 70 may change the power supply voltage applied to the device under measurement 200 according to a change between the first temperature and the second temperature. As shown in Expression 2, the leak current of the device under measurement 200 changes depending on the temperature of the device under measurement 200, and therefore the fluctuation of the leak current of the device under measurement 200 caused by the fluctuation of the power supply voltage of the device under measurement 200 can be suppressed by controlling the ambient temperature of the device under measurement 200.

The current measuring section 40 measures the power supply current supplied to the device under measurement 200 by the power supply section 70. The current measuring section 40 of the present embodiment measures a first power supply current, which is the power supply current when (i) the ambient temperature of the device under measurement is the first temperature and (ii) the power supply voltage applied to the device under measurement 200 is the first power supply voltage. The current measuring section 40 also measures a second power supply current, which is the power supply current when (i) the ambient temperature of the device under measurement 200 is the second temperature and (ii) the power supply voltage applied to the device under measurement 200 is the second power supply voltage.

The current measuring section 40 measures the power supply current in a state where the vector generating section 16 has applied a prescribed logic vector to the device under measurement 200. The vector generating section 16 sequentially supplies the device under measurement 200 with logic vectors that change the logic state of the device under measurement 200. The vector generating section 16 may sequentially supply the device under measurement 200 with logic vectors in a logic vector group designated by a test program provided by the user. The current measuring section 40 measures the power supply current corresponding to each logic vector.

The analyzing section 50 calculates the internal resistance value of the device under measurement 200 based on the first power supply current and the second power supply current measured by the current measuring section 40. More specifically, the analyzing section 50 calculates the internal resistance value based on a ratio between (i) the amount of change of the power supply voltage applied to the device under measurement 200 by the power supply section 70 and (ii) the amount of change of the power supply current measured by the current measuring section 40. When the first power supply voltage is represented as Vddh, the second power supply voltage as Vddl, the first power supply current as Imh, and the second power supply current as Iml, the internal resistance value can be expressed as shown below.

$$R=(Vddh-Vddl)/(Imh-Iml)$$

The configuration described above enables measurement of the power supply current by suppressing the fluctuation of the leak current caused by the fluctuation of the power supply voltage supplied to the device under measurement 200, and can therefore accurately calculate the internal resistance value R. Furthermore, since the fluctuation of the leak current can be suppressed without controlling the substrate voltage of the device under measurement 200, the measurement apparatus 100 can accurately calculate the internal resistance value R even when it is difficult to control the substrate voltage of the device under measurement 200.

Figure 13:
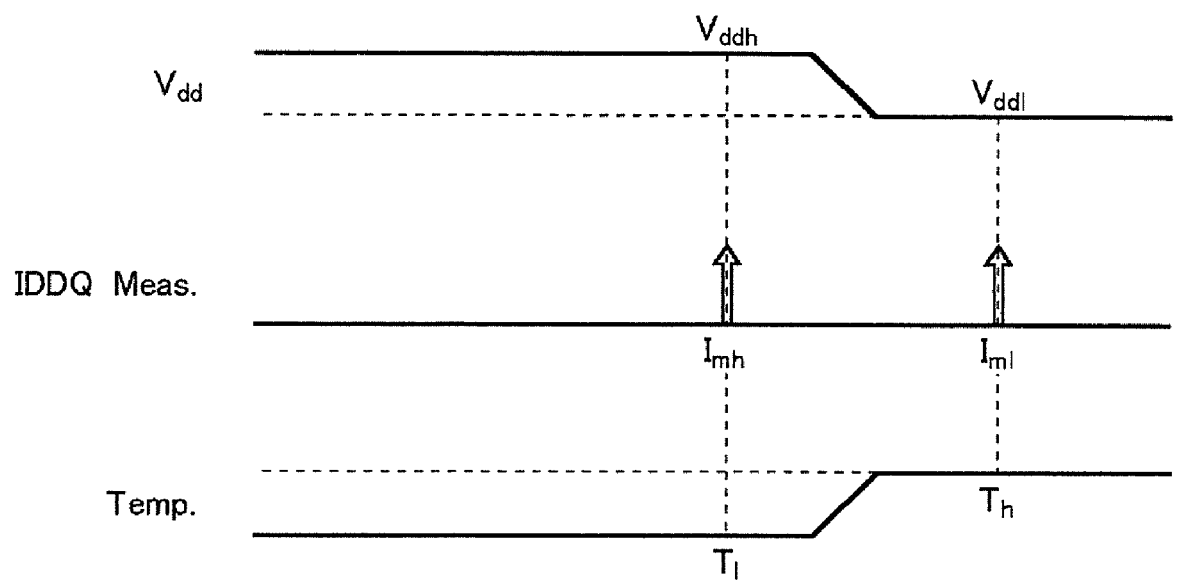
FIG. 13 is a timing chart showing an exemplary operation of the measurement apparatus 100 described in relation to FIG. 12.

FIG. 13 is a timing chart showing an exemplary operation of the measurement apparatus 100 described in relation to FIG. 12. The power supply section 70 of the present embodiment applies the predetermined first power supply voltage Vddh to the device under measurement 200. Then, after the current measuring section 40 has measured the first power supply current Imh for all of the logic vectors in the logic vector group to be applied to the device under measurement 200, the power supply section 70 changes the power supply voltage Vdd being applied to the device under measurement 200 to the predetermined second power supply voltage Vddl. Here, the second power supply voltage Vddl is assumed to be lower than the first power supply voltage Vddh.

When the power supply voltage applied to the device under measurement 200 by the power supply section 70 changes from the first power supply voltage to the second power supply voltage, the temperature control section 60 changes the ambient temperature of the device under measurement 200 from the first temperature to the second temperature. In the present embodiment, the second temperature Th is assumed to be higher than the first temperature Tl. This kind of temperature control can suppress the fluctuation of the leak current caused by the fluctuation of the power supply voltage Vdd.

After a sufficient time has passed for the substrate temperature of the device under measurement 200 to stabilize after the second temperature Th is set, the power supply section 70 may apply each of the above power supply voltages to the device under measurement 200. If the second power supply voltage is higher than the first power supply voltage, the temperature control section 60 may lower the ambient temperature of the device under measurement 200 when the power supply voltage changes from the first power supply voltage to the second power supply voltage.

The temperature control section 60 changes the ambient temperature of the device under measurement 200 by an amount according to the change in the power supply voltage (Vddh−Vddl) applied to the device under measurement 200 by the power supply section 70. For example, the temperature control section 60 determines the amount of temperature change such that change in the leak current caused by the change in the power supply voltage is substantially canceled out by the change in the leak current caused by the change in the ambient temperature.

The temperature control section 60 may be provided with information for canceling out the change in the leak current, such as a table that indicates a relationship between the amount of change in the power supply voltage and the amount of change in the ambient temperature. The temperature control section 60 may extract, from this table, the ambient temperature change amount that corresponds to the change amount in the set value of the power supply voltage. The measurement apparatus 100 may generate the table in advance during calibration.

When the substrate temperature of the device under measurement 200 has stabilized at the second temperature Tl and the second power supply voltage Vddl is supplied to the device under measurement 200, the vector generating section 16 applies a prescribed logic vector group to the device under measurement 200. This logic vector group is desirably the same as the logic vector group that is applied to the device under measurement 200 when the ambient temperature of the device under measurement 200 has stabilized at the first temperature Th and the first power supply voltage Vddh is supplied to the device under measurement 200.

The current measuring section 40 may measure the first power supply current Imh and the second power supply current Iml for each logic vector. The analyzing section 50 may calculate the internal resistance value R of the device under measurement 200 for each logic vector. In this way, defective portions of the device under measurement 200 can be identified.

Figure 14:
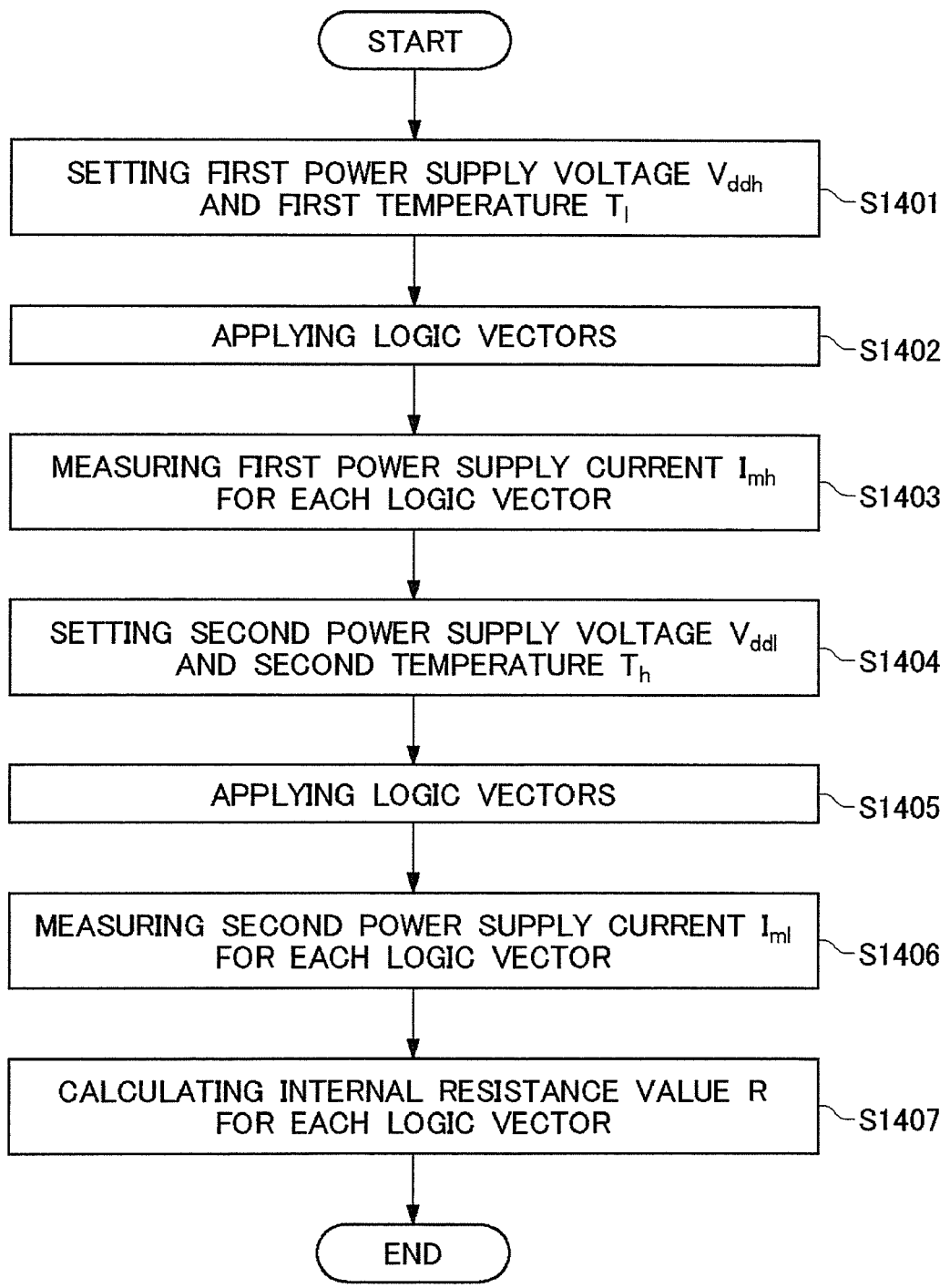
FIG. 14 is a flow chart showing the basic operation performed by the measurement apparatus 100 described in relation to FIG. 12.

FIG. 14 is a flow chart showing the basic operation performed by the measurement apparatus 100 described in relation to FIG. 12. First, the power supply section 70 and the temperature control section 60 set the first power supply voltage Vddh and the first temperature Th (S1401). Then, the vector generating section 16 applies logic vectors to the device under measurement 200 (S1402).

Next, the current measuring section 40 measures the first power supply current Imh for each logic vector (S1403). After the first power supply current Imh has been measured for all of the logic vectors, the power supply section 70 and the temperature control section 60 set the second power supply voltage Vddl and the second temperature Tl (S1404).

Next, the vector generating section 16 applies logic vectors to the device under measurement 200 (S1405). The current measuring section 40 then measures the first power supply current Imh for each logic vector (S1406).

After the second power supply current Iml has been measured for all of the logic vectors, the internal resistance value R is calculated for each logic vector (S1407). In this way, the measurement apparatus 100 can accurately measure the internal resistance value R at each logic state of the device under measurement 200.

Figure 15:
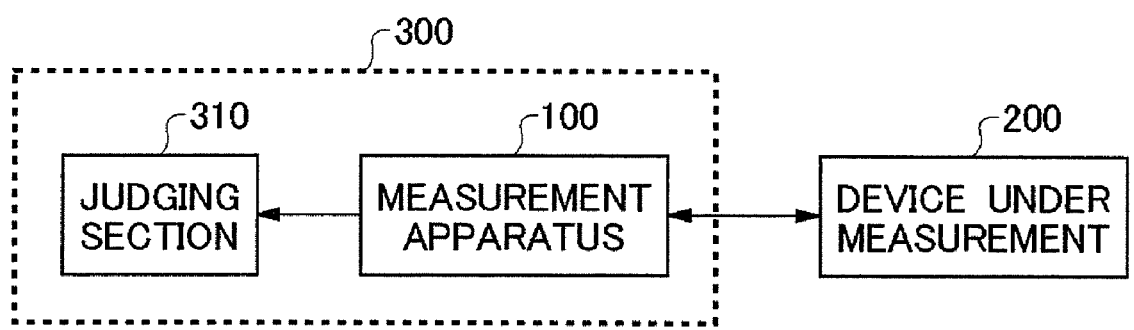
FIG. 15 shows an exemplary configuration of a test system that tests a device under measurement.

FIG. 15 shows an exemplary configuration of a test system that tests a device under measurement. The test system 300 of the present embodiment is provided with a judging section 310 and the measurement apparatus 100. The measurement apparatus 100 may be any one of the measurement apparatuses 100 described in relation to FIGS. 1 to 14.

The judging section 310 judges acceptability of the device under measurement 200 based on the internal resistance value measured by the measurement apparatus 100. The judging section 310 may identify defective portions of the device under measurement 200 based on the measurement result of the internal resistance value for each logic vector.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a measurement apparatus, a test system, and a measurement method that can detect a defect in a miniaturized CMOS circuit.

What is claimed is:

1. A measurement apparatus that measures a device under measurement, comprising:
   a voltage detecting section that detects a power supply voltage applied to the device under measurement;
   a voltage control section that suppresses a fluctuation of a leak current of the device under measurement caused by a fluctuation of the power supply voltage by controlling a substrate voltage of the device under measurement based on the power supply voltage detected by the voltage detecting section; and
   an IDDQ acquiring section that acquires a value of an IDDQ current of the device under measurement by measuring a prescribed characteristic of the device under measurement while the voltage control section suppresses the fluctuation of the leak current.

2. The measurement apparatus according to claim 1, wherein
   a power supply terminal of the device under measurement is connected to a bypass capacitor,
   the measurement apparatus further comprises:
   a power supply section that supplies a power supply power to the power supply terminal; and
   a switch that separates the power supply terminal from the power supply section when the device under measurement has stabilized after a vector that changes a logic state of the device under measurement is applied to the device under measurement, and
   the IDDQ acquiring section acquires the value of the IDDQ current by measuring the prescribed characteristic of the device under measurement after the switch separates the power supply terminal from the power supply section.

3. The measurement apparatus according to claim 2, wherein
the IDDQ acquiring section acquires the value of the IDDQ current based on a discharge speed of the bypass capacitor from when the power supply terminal is separated from the power supply section.

4. The measurement apparatus according to claim 3, wherein
the IDDQ acquiring section measures the voltage of the bypass capacitor at least two different timings.

5. The measurement apparatus according to claim 4, wherein,
the IDDQ acquiring section acquires the value of the IDDQ current based on a value obtained by dividing (i) a product of a capacitance of the bypass capacitor and a difference between the measured voltages of the bypass capacitor by (ii) a difference between the timings at which the voltage of the bypass capacitor is measured.

6. The measurement apparatus according to claim 4, further comprising
a resistance calculating section that calculates a resistance value of the device under measurement in the stabilized state based on the value of the IDDQ current acquired by the IDDQ acquiring section and the measured voltages of the bypass capacitor acquired by the IDDQ acquiring section.

7. The measurement apparatus according to claim 2, further comprising
a calibration section that performs a calibration that calculates an amount by which the substrate voltage is to be changed according to an amount of change in the power supply voltage.

8. The measurement apparatus according to claim 7, wherein
the calibration section detects a substrate voltage that causes the power supply current supplied from the power supply section to the power supply terminal to be a prescribed value when the power supply section changes the power supply voltage applied to the power supply terminal, while the power supply section is connected to the power supply terminal.

9. The measurement apparatus according to claim 7, further comprising
a vector generating section that applies to the device under measurement a logic vector that sets the logic state of the device under measurement, while the power supply section is connected to the power supply terminal.

10. The measurement apparatus according to claim 9, wherein
the calibration section performs the calibration for each logic vector generated by the vector generating section.

11. A measurement apparatus that measures a device under measurement, comprising:
a bypass capacitor that is connected to a power supply terminal of the device under measurement;
a power supply section that supplies a power supply power to the power supply terminal;
a switch that separates the power supply terminal from the power supply section when the device under measurement has stabilized after a vector that changes a logic state of the device under measurement is applied to the device under measurement, and
an IDDQ acquiring section that acquires a value of an IDDQ current by measuring a prescribed characteristic of the device under measurement after the switch separates the power supply terminal from the power supply section.

12. A test system that tests a device under measurement, comprising:
a measurement apparatus that measures a value of an IDDQ current of the device under measurement and calculates an internal resistance value of the device under measurement based on the measured IDDQ current; and
a judging section that judges whether the device under measurement is defective based on the internal resistance value calculated by the measurement apparatus, wherein
the measurement apparatus includes:
a voltage detecting section that detects a power supply voltage applied to the device under measurement;
a voltage control section that suppresses a fluctuation of a leak current of the device under measurement caused by a fluctuation of the power supply voltage by controlling a substrate voltage of the device under measurement based on the power supply voltage detected by the voltage detecting section; and
an IDDQ acquiring section that acquires the value of the IDDQ current of the device under measurement by measuring a prescribed characteristic of the device under measurement while the voltage control section suppresses the fluctuation of the leak current.

13. A method for measuring a device under measurement, comprising:
detecting a power supply voltage applied to the device under measurement;
suppressing a fluctuation of a leak current of the device under measurement caused by a fluctuation of the power supply voltage by controlling a substrate voltage of the device under measurement based on the detected power supply voltage; and
acquiring a value of an IDDQ current of the device under measurement by measuring a prescribed characteristic of the device under measurement while the fluctuation of the leak current is suppressed.

14. A measurement apparatus that measures a device under measurement, comprising:
a power supply section that sequentially applies a first power supply voltage and a second power supply voltage to the device under measurement;
a temperature control section that changes an ambient temperature of the device under measurement from a first temperature to a second temperature, according to the power supply section changing the power supply voltage applied to the device under measurement from the first power supply voltage to the second power supply voltage;
a current measuring section that measures a first power supply current and a second power supply current, the first power supply current being supplied from the power supply section to the device under measurement when (i) the ambient temperature of the device under measurement is the first temperature and (ii) the power supply voltage applied to the device under measurement is the first power supply voltage, and the second power supply current being supplied from the power supply section to the device under measurement when (iii) the ambient temperature of the device under measurement is the second temperature and (iv) the power supply voltage applied to the device under measurement is the second power supply voltage; and an analyzing section that calculates an internal resistance value of the device under measurement based on the first power supply current and the second power supply current.

15. The measurement apparatus according to claim 14, wherein
the power supply section and the temperature control section control the power supply voltage and the ambient temperature of the device under measurement such that (i) a change in a leak current of the device under measurement caused by a change in the power supply voltage applied to the device under measurement is cancelled out by (ii) a change in the leak current of the device under measurement caused by a change in the ambient temperature of the device under measurement.

16. The measurement apparatus according to claim 15, wherein
the temperature control section changes the ambient temperature of the device under measurement to a higher temperature when the power supply voltage applied to the device under measurement by the power supply section changes to a lower power supply voltage, and changes the ambient temperature of the device under measurement to a lower temperature when the power supply voltage applied to the device under measurement by the power supply section changes to a higher power supply voltage.

17. The measurement apparatus according to claim 16, wherein
the temperature control section changes the ambient temperature of the device under measurement by an amount corresponding to an amount of change in the power supply voltage applied to the device under measurement by the power supply section.

18. The measurement apparatus according to claim 17, wherein
the analyzing section calculates the internal resistance value based on a ratio between (i) the amount of change in the power supply voltage supplied to the device under measurement by the power supply section and (ii) an amount of change in the power supply current measured by the current measuring section.

19. The measurement apparatus according to claim 18, further comprising
a vector generating section that applies a group of logic vectors to the device under measurement, the group of logic vectors being the same when the ambient temperature of the device under measurement is the first temperature and when the ambient temperature of the device under measurement is the second temperature, wherein
the current measuring section measures the first power supply current and the second power supply current for each logic vector, and
the analyzing section calculates the internal resistance value for each logic vector.

20. A test system that tests a device under measurement, comprising:
a measurement apparatus that measures an internal resistance value of the device under measurement; and
a judging section that judges whether the device under measurement is defective based on the internal resistance value measured by the measurement apparatus, wherein
the measurement apparatus includes:
a power supply section that sequentially applies a first power supply voltage and a second power supply voltage to the device under measurement;
a temperature control section that changes an ambient temperature of the device under measurement from a first temperature to a second temperature, according to the power supply section changing the power supply voltage applied to the device under measurement from the first power supply voltage to the second power supply voltage; a current measuring section that measures a first power supply current and a second power supply current, the first power supply current being supplied from the power supply section to the device under measurement when (i) the ambient temperature of the device under measurement is the first temperature and (ii) the power supply voltage applied to the device under measurement is the first power supply voltage, and the second power supply current being supplied from the power supply section to the device under measurement when (iii) the ambient temperature of the device under measurement is the second temperature and (iv) the power supply voltage applied to the device under measurement is the second power supply voltage; and
an analyzing section that calculates the internal resistance value of the device under measurement based on the first power supply current and the second power supply current.

21. A method for measuring a device under measurement, comprising:
sequentially applying a first power supply voltage and a second power supply voltage to the device under measurement;
changing an ambient temperature of the device under measurement from a first temperature to a second temperature, according a change in the power supply voltage applied to the device under measurement from the first power supply voltage to the second power supply voltage;
measuring a first power supply current and a second power supply current, the first power supply current being supplied to the device under measurement when (i) the ambient temperature of the device under measurement is the first temperature and (ii) the power supply voltage applied to the device under measurement is the first power supply voltage, and the second power supply current being supplied to the device under measurement when (iii) the ambient temperature of the device under measurement is the second temperature and (iv) the power supply voltage applied to the device under measurement is the second power supply voltage; and
calculating an internal resistance value of the device under measurement based on the first power supply current and the second power supply current.

* * * * *